US008975724B2

(12) United States Patent
Park et al.

(10) Patent No.: US 8,975,724 B2
(45) Date of Patent: Mar. 10, 2015

(54) ANTI-FUSE DEVICE

(75) Inventors: Yong Park, San Diego, CA (US);
Zhongze Wang, San Diego, CA (US);
John J. Zhu, San Diego, CA (US);
Choh fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 13/613,008

(22) Filed: Sep. 13, 2012

(65) Prior Publication Data

US 2014/0070364 A1    Mar. 13, 2014

(51) Int. Cl.
*H01L 23/525* (2006.01)
*G11C 17/16* (2006.01)
*H01L 27/06* (2006.01)
*H01L 27/10* (2006.01)
*H01L 27/112* (2006.01)

(52) U.S. Cl.
CPC ............ *H01L 23/5252* (2013.01); *G11C 17/16* (2013.01); *H01L 27/0617* (2013.01); *H01L 27/0629* (2013.01); *H01L 27/101* (2013.01); *H01L 27/11206* (2013.01)
USPC ............ 257/530; 257/529; 257/202; 438/600

(58) Field of Classification Search
CPC .......................... H01L 23/525; H01L 23/5252
USPC .......................................... 257/530, 529, 202
See application file for complete search history.

(56) References Cited

U.S. PATENT DOCUMENTS

| 4,823,181 | A | 4/1989 | Mohsen et al. | |
|---|---|---|---|---|
| 5,663,091 | A | 9/1997 | Yen et al. | |
| 6,069,064 | A | 5/2000 | Cutter et al. | |
| 7,087,975 | B2 * | 8/2006 | Lehmann et al. | 257/530 |
| 7,279,772 | B2 | 10/2007 | Trivedi | |
| 7,741,697 | B2 | 6/2010 | Chen | |
| 7,982,285 | B2 | 7/2011 | Park et al. | |
| 8,101,471 | B2 | 1/2012 | Hafez et al. | |
| 2004/0129999 | A1 | 7/2004 | Jung | |
| 2004/0217441 | A1 * | 11/2004 | Lehmann et al. | 257/530 |
| 2008/0029844 | A1 * | 2/2008 | Adkisson et al. | 257/530 |
| 2009/0141533 | A1 | 6/2009 | Kim et al. | |
| 2009/0189248 | A1 * | 7/2009 | Kitamura et al. | 257/530 |
| 2011/0012629 | A1 | 1/2011 | Chakravarti et al. | |
| 2011/0108926 | A1 | 5/2011 | Bahl | |
| 2013/0062698 | A1 | 3/2013 | Agam et al. | |

FOREIGN PATENT DOCUMENTS

| JP | 2008227049 A | 9/2008 |
|---|---|---|
| KR | 20040059819 A | 7/2004 |
| WO | 0227784 A2 | 4/2002 |

OTHER PUBLICATIONS

International Search Report and Written Opinion—PCT/US2013/059798—ISA/EPO—Dec. 13, 2013.

* cited by examiner

*Primary Examiner* — Marc Armand
(74) *Attorney, Agent, or Firm* — Sam Talpalatsky; Nicholas J. Pauley; Joseph Agusta

(57) ABSTRACT

An electrically programmable gate oxide anti-fuse device includes an anti-fuse aperture having anti-fuse links that include metallic and/or semiconductor electrodes with a dielectric layer in between. The dielectric layer may be an interlayer dielectric (ILD), an intermetal dielectric (IMD) or an etch stop layer. The anti-fuse device may includes a semiconductor substrate having a conductive gate (e.g., a high K metal gate) disposed on a surface of the substrate, and a dielectric layer disposed on the conductive gate. A stacked contact can be disposed on the dielectric layer and a gate contact is disposed on an exposed portion of the gate.

18 Claims, 7 Drawing Sheets

ANTI-FUSE DEVICE

TECHNICAL FIELD

The present disclosure relates generally to anti-fuse devices. More specifically, the disclosure relates to an electrically programmable anti-fuse device and also a method of manufacturing the electrically programmable anti-fuse device.

BACKGROUND

Programmable links are electrical interconnects that are broken or created at selected electronic Bodes to activate or deactivate the selected electronic nodes. The activation/deactivation of the selected electronic interconnects may be performed by a user after an integrated circuit is fabricated and packaged. The combination of activated and deactivated electronic interconnects represents a digital bit pattern signifying data the user wishes to store.

In recent years, another type of programmable link, called an anti-fuse link, has been developed for use in integrated circuit applications. Instead of the programming mechanism causing an open circuit, as is the case with fusible links, the programming mechanism in anti-fuse circuits creates short circuit or a relatively low resistance link. Anti-fuse links consist of two conductor and/or semiconductor materials having a dielectric or insulating material between the conductive materials. During programming, the dielectric at selected points in between the conductive materials is broken down by predetermined applied voltages, thereby electrically connecting the conducting or semiconducting materials together.

The anti-fuse device can be integrated into a semiconductor memory cell having a data storage element constructed around an ultra-thin dielectric, such as agate oxide. The anti-fuse device can be implemented to store information by stressing a dielectric into breakdown (soft or hard breakdown) to set a leakage current level of the memory cell. The memory cell is read by sensing the current drawn by the cell.

Recent growth in the use of anti-fuse devices to provide read-only memory cells is being driven by an increased demand for secure computing. In particular, digital security applications, for example, specify a large number of encrypted, programmable read only memory cells. Unfortunately, standard anti-fuse manufacturing generally specifies the use of several mask, deposition or etching steps during or after the formation of the anti-fuse, thus increasing the fabrication complexity and cost of an integrated circuit.

SUMMARY

According to one aspect of the present disclosure, a gate oxide anti-fuse device is described. The gate oxide anti-fuse device includes a semiconductor substrate having a gate disposed on a surface of the substrate. The gate oxide anti-fuse device may also include a dielectric layer disposed on the gate. The gate oxide anti-fuse device may also include a stacked contact disposed on the dielectric layer. The gate oxide anti-fuse device may also include a gate contact disposed on the gate.

According to another aspect of the present disclosure, a gate oxide anti-fuse device fabrication method is described. The method includes forming a conductive gate on a semiconductor substrate. The method may also include depositing a dielectric layer on the conductive gate. The method further includes exposing a portion of the conductive gate. The method may also include fabricating a gate contact on the exposed portion of the conductive gate. The method further includes forming a stacked contact on the dielectric layer.

According to one aspect of the present disclosure, a gate oxide anti-fuse device is described. The gate oxide anti-fuse device includes a semiconductor substrate. The gate oxide anti-fuse device may also include a conductive gate disposed on a surface of the substrate. The gate oxide anti-fuse device may also include means for insulating, disposed on the conductive gate. The gate oxide anti-fuse device may further include first means for conducting disposed on the conductive gate. The gate oxide anti-fuse device may also include second means for conducting, disposed on the insulating means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

One aspect of the disclosure describes an electrically programmable gate oxide anti-fuse device, and a method of manufacturing the anti-fuse device. The anti-fuse device may include an anti-fuse aperture having anti-fuse links that include metallic and/or semiconductor electrodes with an etch stop layer in between. The etch stop layer may be an interlayer dielectric (ILD) or an intermetal dielectric (IMD) implemented as a layer of dielectric between two electrodes. In one configuration, the anti-fuse device includes a semiconductor substrate having a conductive gate (e.g., a high K metal gate) disposed on a surface of the substrate, and a dielectric layer disposed on the conductive gate. A stacked contact is disposed on the dielectric layer and a gate contact is disposed on an exposed portion of the gate. Current process technologies that support high K metal gate (HKMG) implementations enable fabrication of an anti-fuse device without additional masks or layers.

Figure 1:
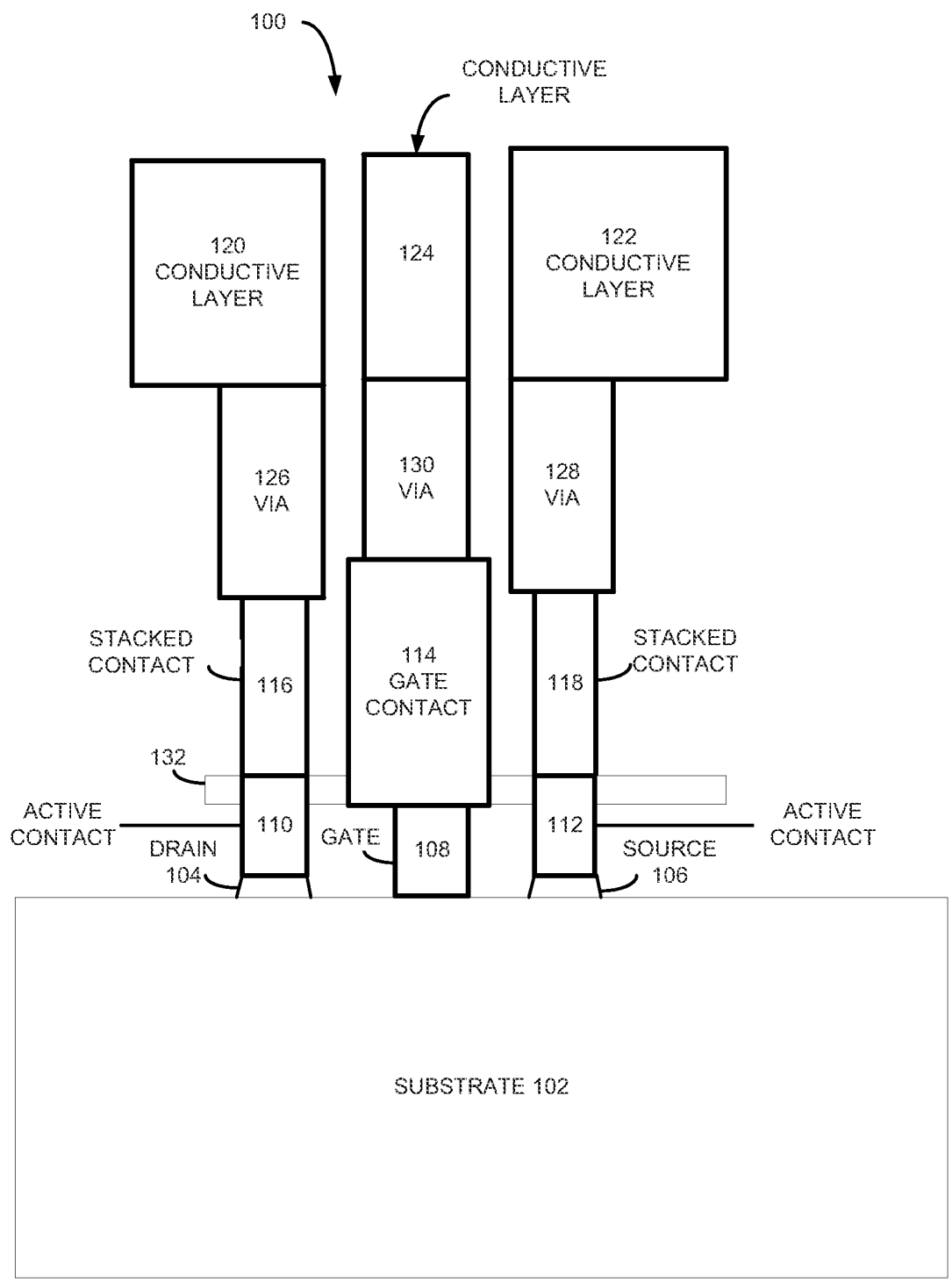
FIG. 1 illustrates a logic structure fabricated according to a current process technology from which an anti-fuse device is implemented.

FIG. 1 illustrates a logic structure 100 that may be implemented with existing process technology. The logic structure 100 is fabricated on a semiconductor substrate 102 in which an active region may be formed. Source and drain regions 104 and 106 may be formed in the active region. A conductive gate a high K metal gate (HKMG)) 108 as well as a set of active (oxide diffusion (OD)) contacts 110 and 112 are formed on the semiconductor substrate 102. A polysilicon (gate) contact 114 is directly coupled to the conductive gate 108. The active contacts 110 and 112 are coupled to the source and drain regions 104 and 106, respectively. A set of stacked contacts 116 and 118 are coupled to the set of active contacts 110 and 112, respectively.

As shown in FIG. 1, the set of stacked contacts 116 and 118 are formed onto the set of active contacts 110 and 112, respectively without an intervening layer. The logic structure 100 also includes conductive layers (e.g., m1 metal layers) 120, 122 and 124 for coupling to electronic devices or circuits such as other layers of the conductive stack. The conductive layers 120, 122 and 124 may be configured to receive supply voltages designated as VSS and VDD. The conductive layers 120 and 122 may be coupled to the stacked contacts 116 and 118, respectively, by vias 126 and 128, respectively. The conductive layer 124 may be coupled to the gate (e.g. polysilicon) contact 114 by via 130.

An etch stop layer (e.g., a photo resist layer) 132 may be disposed within the logic structure 100. The etch stop layer 132 may include a photo-resist pattern formed on the conductive gate 108 to implement a gate pattern. The conductive gate 108 may be etched by using the photo resist pattern as an etch mask to form the gate pattern provided over the active region of the semiconductor substrate 102. In the resulting configuration, the etch stop layer 132 is not between the conductive gate 108 (e.g., high K metal gate) and the gate contact 114 because the etch stop layer 132 is etched away while fabricating the conductive gate. In addition, the etch stop layer 132 does not separate the stacked contacts 116 and 118 from the active contacts 110 and 112 because a portion of the etch stop layer 132 is etched away prior to depositing the contacts 116 and 118 on the active contacts 110 and 112.

An anti-fuse device may be implemented using the masks and processes used for fabricating the logic structure 100 at no additional cost. An anti-fuse device may include an anti-fuse link with a dielectric material between the conductive elements (e.g., conductive gate 108 and stacked contact 116/118). During programming, the dielectric material between the conductive elements is broken down by a current developed from a predetermined programming voltage applied to the stacked contacts 116 and/or 118 from a conductive layer (e.g., conductive layers 120 and/or 122).

Figure 2:
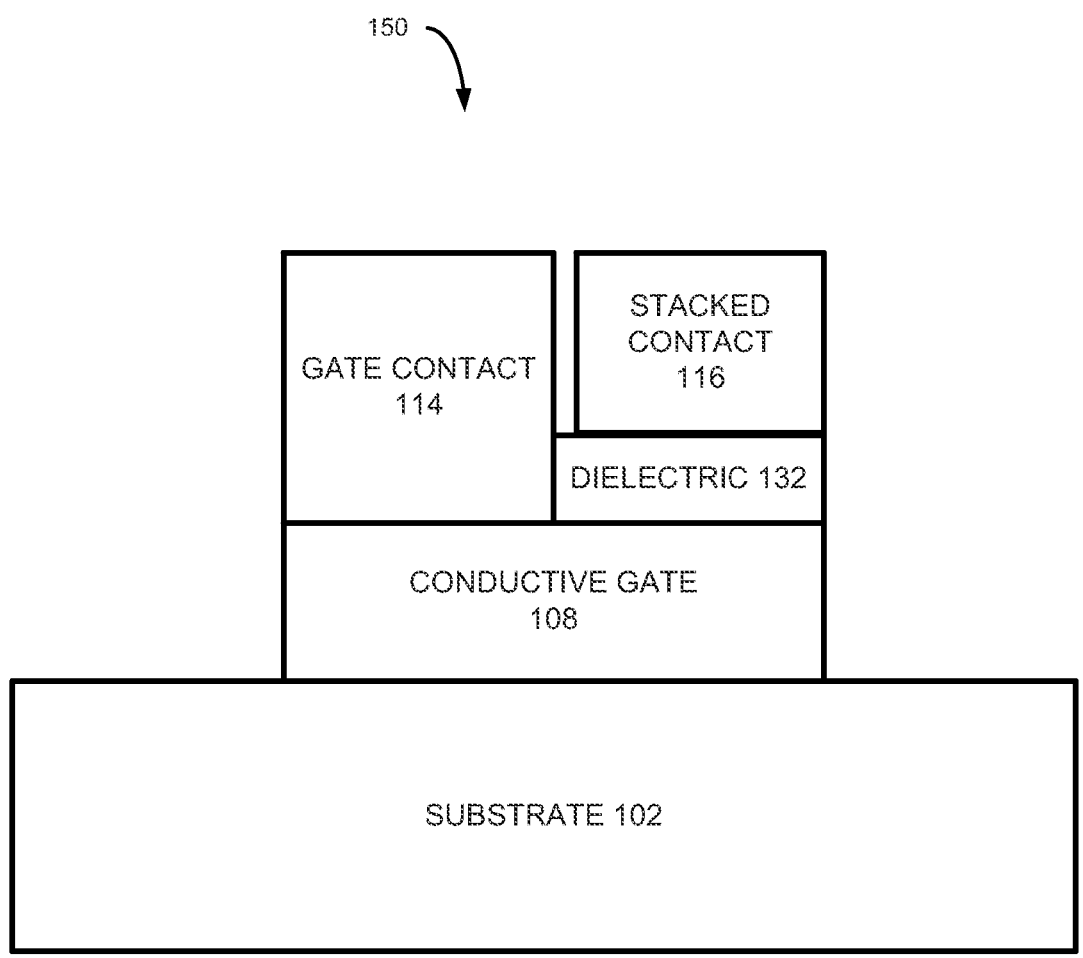
FIG. 2 is an example of an anti-fuse configuration fabricated with a process that is compatible with a process for forming the logic structure of FIG. 1.

FIG. 2 is an example of an anti-fuse configuration 150 based on the process to create the logic structure of FIG. 1. This anti-fuse configuration 150 includes a gate (e.g. polysilicon) contact 114, the stacked contact 116, the etch stop layer 132 and the conductive gate 108 from the logic structure 100 of FIG. 1. In the configuration shown in FIG. 2, the etch stop layer 132 functions as a dielectric material (e.g., a nitride layer) between the stacked contact 116 and the conductive gate 108. For example, the dielectric 132 may include a gate dielectric material such as an inter layer dielectric or an inter metal dielectric. The etch stopper layer 132 may have a thickness of about 10 Angstroms, in one configuration. The gate contact 114 may be formed directly onto the conductive gate 108. In addition, the stacked contact 116 is adjacent to the gate contact 114.

As shown in FIG. 2, the stacked contact 116 is disposed on the etch stop layer 132 in an area over the conductive gate 108, such that the etch stop layer 132 is disposed between two electrodes: the stacked contact (upper electrode) 116 and the conductive gate (lower electrode) 108 to form the anti-fuse configuration 150. The conductive gate 108 is on the semiconductor substrate 102. The gate contact 114 may be coupled to the conductive gate 108 to facilitate connection to an external electronic device, such as an inverter or a memory cell. For example, the gate contact 114, may be configured to read an output of the anti-fuse device.

The anti-fuse device is programmed by applying different voltages onto the gate contact 114 and between the conductive gate 108 and the stacked contact 116. The voltages should be sufficient to break down the dielectric layer 132 to cause the conductive gate 108 and the stacked contact 116 to electrically communicate. That is, a current density dissipates power in a small area of the anti-fuse device, which breaks down the dielectric layer 132 between the conductive gate 108 and the stacked contact 116. The breakdown of the dielectric layer 132 forms a conductive link between the stacked contact (upper electrode) 116 and the conductive gate 108 (lower electrode).

Figure 3:
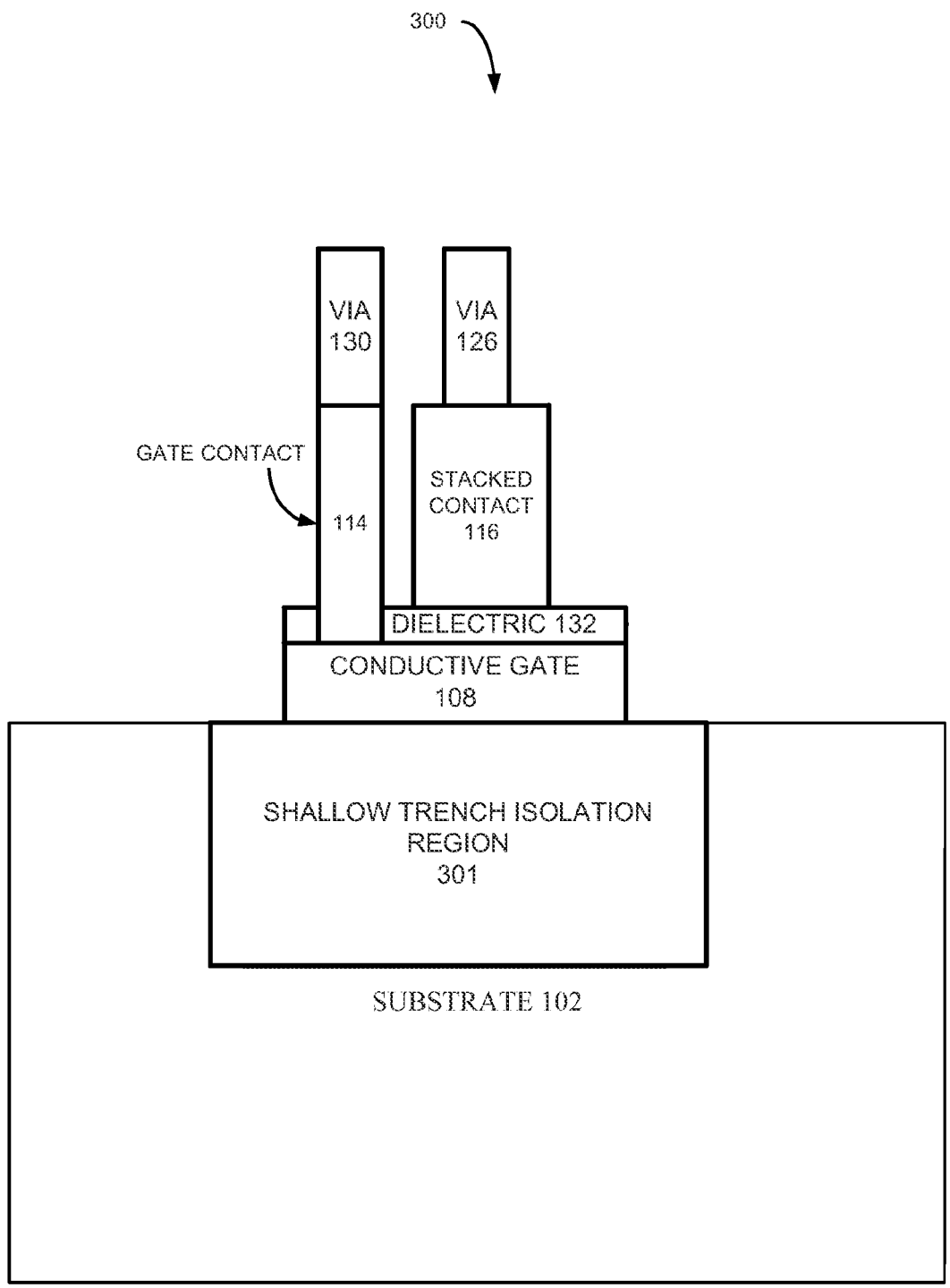
FIG. 3 is an example of an anti-fuse device according to one aspect of the present disclosure.

Further elements of the anti-fuse configuration of FIG. 2 are illustrated in FIG. 3 according to one aspect of the present disclosure. Representatively, an anti--fuse device 300 includes the conductive gate (e.g. HKMG) 108 as a lower electrode, a gate contact 114, vias 126 and 130, a dielectric layer (e.g., etch stop layer) 132, and a stacked contact 116 as an upper electrode. The gate contact 114 and the stacked contact 116 can be coupled to other electronic devices (e.g., voltage sources VSS, VDD, conductive elements and the like). As shown in FIG. 3, the gate contact 114 and the stacked contact 116 may receive or transmit voltages to/from the conductive gate 108 through the vias 126 and 130. In one aspect of the present disclosure, the conductive gate 108 is implemented as a cathode and the stacked contact 116 is implemented as an anode of the anti-fuse device 300. Conversely, the conductive gate 108 or the stacked contact 116 can be implemented as an anode or a cathode.

The conductive gate 108, the gate contact 114, the vias 126 and 130, the stacked contact 116 and the dielectric layer 132 can be formed using existing fabrication processes with no additional masks or layers. For example, some aspects of the anti-fuse device can be formed using conventional chemical vapor deposition (CVD) techniques, plasma-enhanced CVD (PECVD), techniques or the like. In one configuration, the anti-fuse device 300 is implemented on top of a shallow trench isolation region 301 of a substrate 102 to reduce breakdown of active devices (not shown) in the semiconductor substrate 102 due to electrical current leakage.

Figure 4:
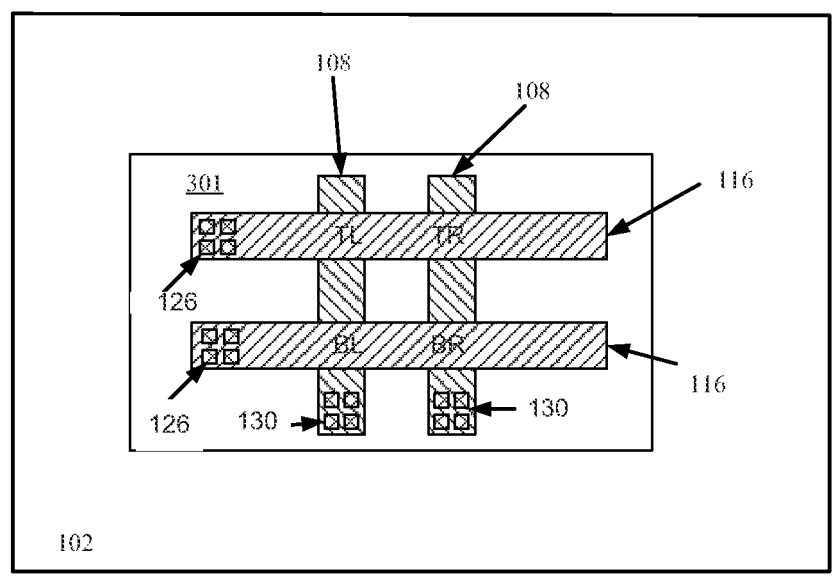
FIG. 4 is a top view of an exemplary pattern of anti-fuse devices, such as shown in FIG. 3.

An example layout of anti-fuse devices of FIG. 3 is illustrated in FIG. 4. Representatively, anti-fuse patterns may be implemented in overlapping areas including the top left (TL), bottom left (BL), top right (TR), and bottom right (BR) positions of the stacked contact 116 and the conductive gate 108. The layout includes the stacked contact (upper electrode) 116 and the conductive gate 108 (bottom electrode), as well as the vias 126, 130, all over the shallow trench isolation region 301 of the substrate 102. Although the configuration is shown as being disposed over a shallow trench isolation region, the present disclosure is not so limited. Exemplary widths of the stacked contact 116 and the conductive gate 108 at the (TL), bottom left (BL), top right (TR), bottom right (BR) positions are illustrated in Table 1.

TABLE 1

| Pattern | Conductive Gate Width | Stacked Contact Width |
|---------|----------------------|----------------------|
| TL | 36 | 40 |
| TR | 70 | 40 |
| BL | 36 | 50 |
| BR | 70 | 50 |

Figure 5:
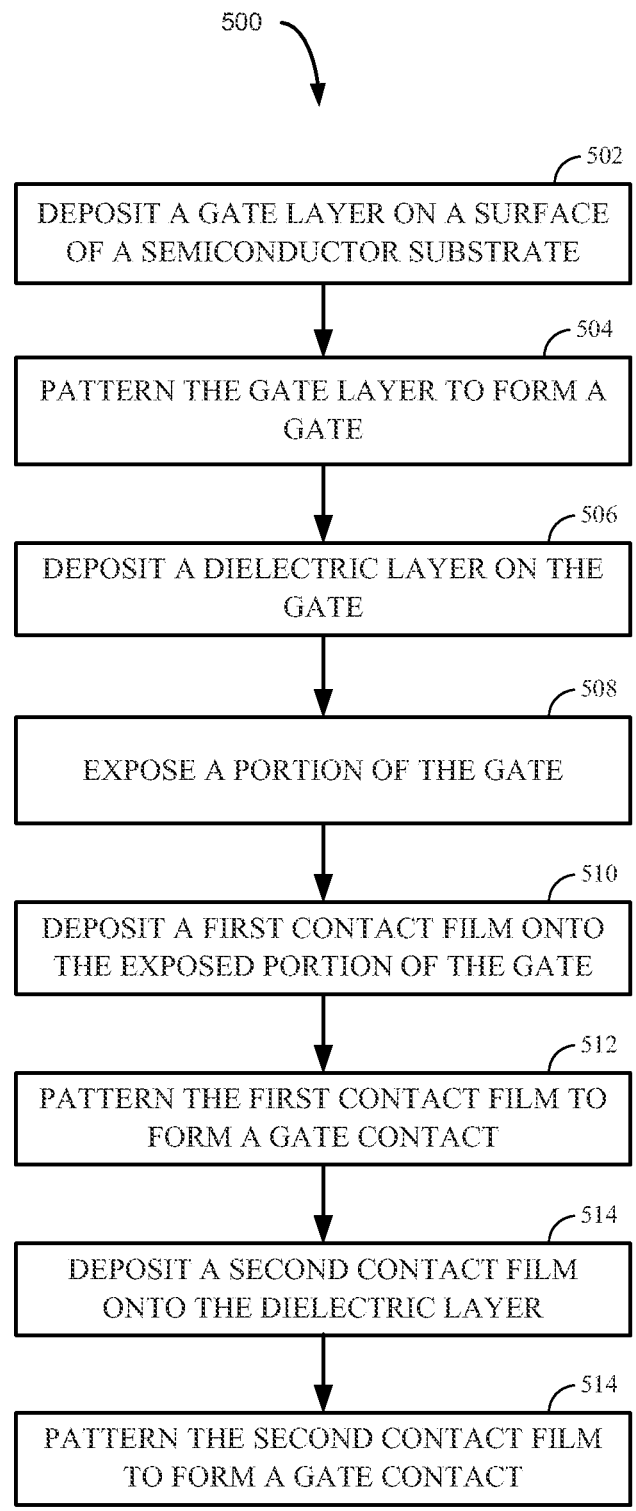
FIG. 5 illustrates a method for implementing an anti-fuse device according to an aspect of the present disclosure.

FIG. 5 illustrates a method 500 for implementing an anti-fuse device according to an aspect of the present disclosure. The method includes depositing a gate layer on a surface of a semiconductor substrate at block 502. At block 504, the gate layer is patterned to form a conductive gate. In the configuration shown in FIG. 3, the conductive gate 108 is a high-k metal gate (HKMG) that is formed on a shallow trench isolation region 301 within the semiconductor substrate 102. At block 506, a dielectric layer is deposited onto the conductive gate. For example, as shown in FIG. 3, the dielectric layer 132 is formed on the conductive gate 108.

At block 508, a portion of the conductive gate 108 is exposed, for example by etching or some other material removal process. At block 510, a first contact film is deposited onto the exposed portion of the conductive gate 108. At block 512, the first contact film is patterned to form a gate contact. For example, FIG. 3 illustrates the gate contact 114 formed directly onto the conductive gate 108. At block 514, a second contact film is deposited onto the dielectric layer, and at block 516, the second contact film is patterned, to form a stacked contact. For example, as shown in FIG. 3, the stacked contact 116 is formed onto the dielectric layer 132 and separate from the conductive gate 108. In this configuration, the stacked contact 116 operates as an upper electrode and, the conductive gate 108 operates as a lower electrode with the dielectric layer 132 separating the upper electrode (stacked contact 116) and the lower electrode (conductive gate 108).

In one configuration, the device includes means for insulating, disposed on the conductive gate. In one aspect of the disclosure, the insulating means may be the dielectric layer 132 configured to perform the functions recited by the insulating means. The device may also include first means for conducting disposed on the conductive gate. In one aspect of the disclosure, the first conducting means may be the gate contact 114 configured to perform the functions recited by the first conducting means. The device may also include second means for conducting disposed on the insulating means. In one aspect of the disclosure, the second conducting means may be the stacked contact 116 and/or the stacked contact 118 configured to perform the functions recited by the second conducting means. In another aspect, the aforementioned means may be any device configured to perform the functions recited by the aforementioned means.

Figure 6:
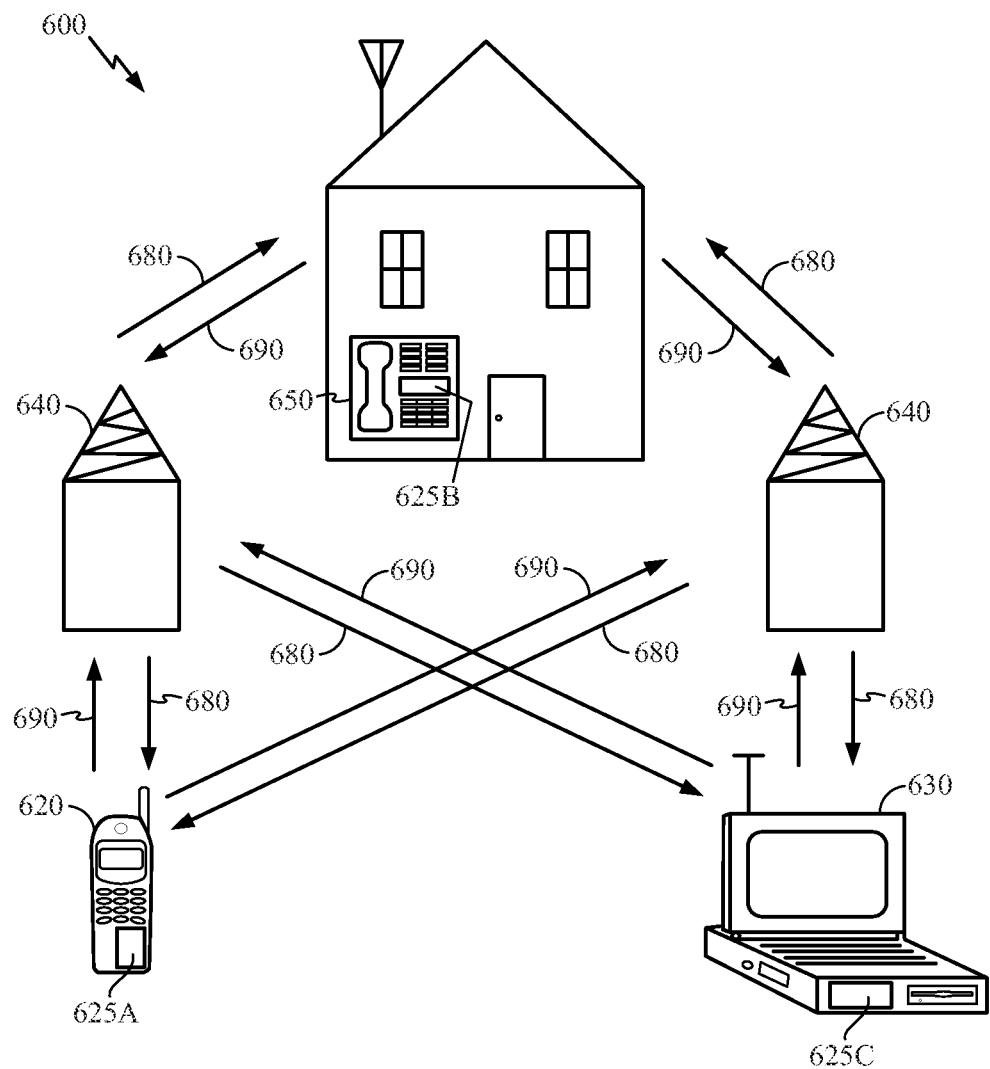
FIG. 6 shows an exemplary wireless communication system in which an embodiment of the disclosure may be advantageously employed.

FIG. 6 shows an exemplary wireless communication system in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include anti-fuse devices 625A, 625B, 625C. FIG. 6 shows forward link signals 680 from the base stations 640 and the remote units 620, 630, and 650 and reverse link signals 690 from the remote units 620, 630, and 650 to base stations 640.

In FIG. 6, the remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 6 illustrates remote units, which may employ an anti-fuse device 625A, 625B, 625C according to the teachings of the disclosure, the disclosure is not limited to these exemplary illustrated units. For instance, an anti-fuse device according to aspects of the present disclosure may be suitably employed in any device.

Figure 7:
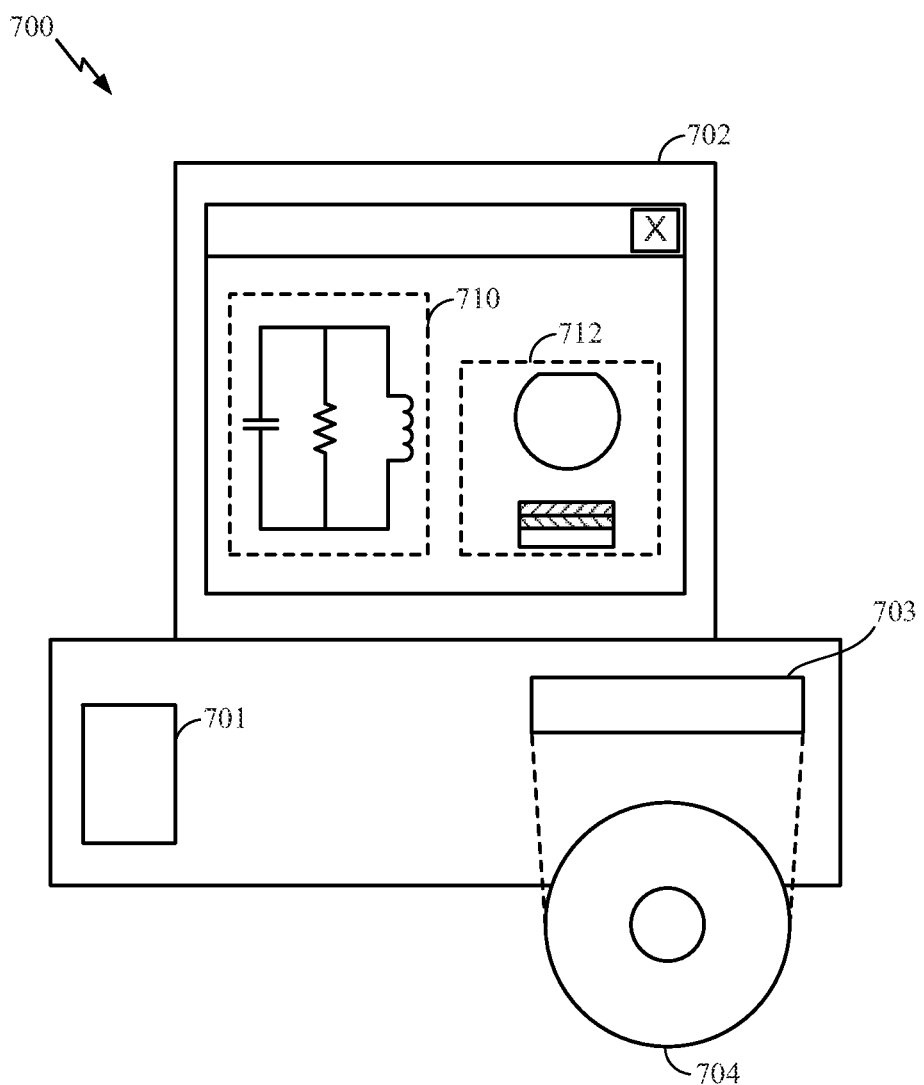
FIG. 7 is a block diagram illustrating a design workstation used for circuit, layout, and logic design of a semiconductor component according to one aspect of the present disclosure.

FIG. 7 is a block diagram illustrating a design workstation used for circuit, layout, and logic design of a semiconductor component, such as the anti-fuse device disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as an anti-fuse device. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 7800 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A gate oxide anti-fuse device comprising:
   a semiconductor substrate having an active region;
   a gate disposed on an active surface of the active region of the semiconductor substrate;
   a dielectric layer disposed on the gate;
   a stacked contact disposed on a surface of the dielectric layer opposite the gate, the dielectric layer disposed between the stacked contact and the gate; and
   a gate contact disposed on the gate.

2. The gate oxide anti-fuse device of claim 1, in which the gate comprises a metal gate with a high dielectric constant.

3. The gate oxide anti-fuse device of claim 2, in which the metal gate is disposed on a shallow trench isolation region of the substrate.

4. The gate oxide anti-fuse device of claim 1, in which the dielectric layer comprises silicon nitride.

5. The gate oxide anti-fuse device of claim 1, further comprising a via formed on the stacked contact.

6. The gate oxide anti-fuse device of claim 1, further comprising a via formed on the gate contact.

7. The gate oxide anti-fuse device of claim 1, integrated into a cell phone, a hand-held personal communication system (PCS) unit, a set top box, a music player, a video player, an entertainment unit, a navigation device, a portable data unit, and/or a fixed location data unit.

8. A gate oxide anti-fuse device comprising:
   a semiconductor substrate having an active region;
   a conductive gate disposed on an active surface of the active region of the substrate;
   means for insulating, disposed on the conductive gate;
   first means for conducting disposed on a surface of the insulating means opposite the conductive gate, the insulating means disposed between the first conducting means and the conductive gate; and
   second means for conducting, disposed on the insulating means.

9. The gate oxide anti-fuse device of claim 8, further comprising means for interconnecting layers formed on the second conducting means.

10. The gate oxide anti-fuse device of claim 8, further comprising means for interconnecting layers formed on the first conducting means.

11. The gate oxide anti-fuse device of claim 8, integrated into a cell phone, a hand-held personal communication system (PCS) unit, a set top box, a music player, a video player, an entertainment unit, a navigation device, a portable data unit, and/or a fixed location data unit.

12. A gate oxide anti-fuse device fabrication method, comprising:
   forming a conductive gate on an active surface of an active region of a semiconductor substrate;
   depositing a dielectric layer on the conductive gate;
   exposing a portion of the conductive gate;
   fabricating a gate contact on the exposed portion of the conductive gate; and
   forming a stacked contact on a surface of the dielectric layer opposite the conductive gate, the dielectric layer disposed between the stacked contact and the conductive gate.

13. The method of claim 12, in which forming the conductive gate further comprises forming the conductive gate on a shallow trench isolation region of the semiconductor substrate.

14. The method of claim 12, further comprising forming a via on the stacked contact.

15. The method of claim 12, further comprising forming a via on the gate contact.

16. The method of claim 12, further comprising integrating the gate oxide anti-fuse device into a cell phone, a hand-held personal communication system (PCS) unit, a set top box, a music player, a video player, an entertainment unit, a navigation device, a portable data unit, and/or a fixed location data unit.

17. A gate oxide anti-fuse device fabrication method, comprising the steps of:
- forming a conductive gate on an active surface of an active region of a semiconductor substrate;
- depositing a dielectric layer on the conductive gate;
- exposing a portion of the conductive gate;
- fabricating a gate contact on the exposed portion of the conductive gate; and
- forming a stacked contact on a surface of the dielectric layer opposite the conductive gate, the dielectric layer disposed between the stacked contact and the conductive gate.

18. The method of claim 17, further comprising the step of integrating the gate oxide anti-fuse device into a cell phone, a hand-held personal communication system (PCS) unit, a set top box, a music player, a video player, an entertainment unit, a navigation device, a portable data unit, and/or a fixed location data unit.

* * * * *